(12) United States Patent
Cleeves

(10) Patent No.: US 6,786,998 B1
(45) Date of Patent: Sep. 7, 2004

(54) WAFER TEMPERATURE CONTROL APPARATUS AND METHOD

(75) Inventor: James Montague Cleeves, Redwood City, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 621 days.

(21) Appl. No.: 08/581,347

(22) Filed: Dec. 29, 1995

(51) Int. Cl.$^7$ ................................................ C23F 1/02
(52) U.S. Cl. ........................ 156/345.51; 156/643.1; 257/796; 361/234; 427/38; 204/193; 204/298.31; 438/689; 118/715; 118/728
(58) Field of Search .............................. 156/643, 643.1, 156/345.51, 345.52, 345; 257/796; 361/234; 427/38; 118/715, 728; 216/58; 204/193, 298.31; 438/689

(56) References Cited

U.S. PATENT DOCUMENTS

| | | | | |
|---|---|---|---|---|
| 4,615,755 A | * | 10/1986 | Tracy et al. ................. | 156/345 |
| 4,931,135 A | * | 6/1990 | Horiuchi et al. ............. | 156/643 |
| 4,938,992 A | * | 7/1990 | Mears .......................... | 427/38 |
| 5,089,880 A | * | 2/1992 | Meyer et al. .................. | 357/15 |
| 5,096,536 A | * | 3/1992 | Cathey, Jr. ................... | 156/643 |
| 5,155,331 A | * | 10/1992 | Horiuchi et al. ........ | 219/121.43 |
| 5,173,766 A | * | 12/1992 | Long et al. .................. | 257/687 |
| 5,177,363 A | * | 1/1993 | Velbeck et al. .............. | 250/337 |
| 5,310,453 A | * | 5/1994 | Fukasawa et al. ........... | 156/643 |
| 5,311,060 A | * | 5/1994 | Rostoker et al. ............. | 257/796 |
| 5,514,243 A | * | 5/1996 | Matsuda et al. ............. | 156/345 |
| 5,529,657 A | * | 6/1996 | Ishii ............................ | 156/345 |
| 5,636,098 A | * | 6/1997 | Salfelder et al. ............. | 361/234 |
| 5,653,619 A | * | 8/1997 | Cloud et al. .................. | 445/24 |
| 5,695,566 A | * | 12/1997 | Suzuki et al. ................ | 118/723 |
| 5,698,070 A | * | 12/1997 | Hirano et al. ............. | 156/643.1 |
| 5,711,851 A | * | 1/1998 | Blalock et al. ........... | 156/643.1 |
| 5,753,132 A | * | 5/1998 | Shamouilian et al. ......... | 216/33 |
| 5,811,820 A | * | 9/1998 | Kirchner et al. ............. | 250/432 |
| 5,827,102 A | * | 10/1998 | Watkins et al. ............... | 445/25 |
| 5,866,979 A | * | 2/1999 | Cathey, Jr. et al. .......... | 313/496 |
| 5,870,271 A | * | 2/1999 | Herchen ...................... | 361/234 |
| 6,066,507 A | * | 5/2000 | Rolfson et al. ............... | 438/20 |

* cited by examiner

Primary Examiner—Lynette R. F. Smith
Assistant Examiner—Ginny Allen Portner
(74) Attorney, Agent, or Firm—Evan Law Group LLC

(57) ABSTRACT

An assembly for holding a substrate is provided. The substrate has a first surface, a second surface, opposite the first surface and an outer peripheral portion. The assembly includes a holding body having a support surface for supporting the substrate. The holding body has an aperture for passing therethrough a gas having a thermal conductivity. Additionally, the assembly includes a heat transferring seal having a first surface for frictionally engaging the second surface of the substrate. The heat transferring seal has a second surface, opposite the first surface, for frictionally engaging the support surface of the holding body. The heat transferring seal also has an inner peripheral portion defining an opening for receiving the gas. The heat transferring seal has a thermal conductivity closely matched with the first thermal conductivity of the gas for providing substantially uniform heat transfer across the substrate.

20 Claims, 6 Drawing Sheets

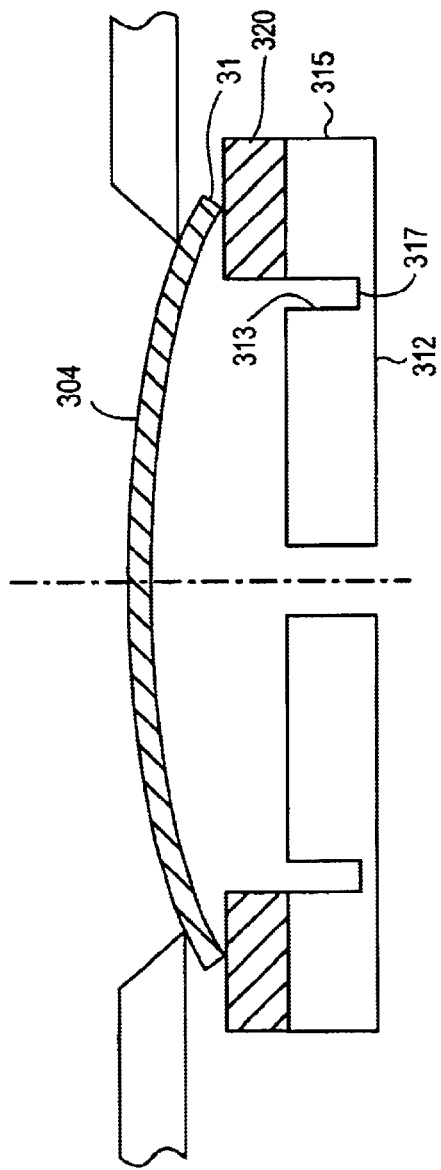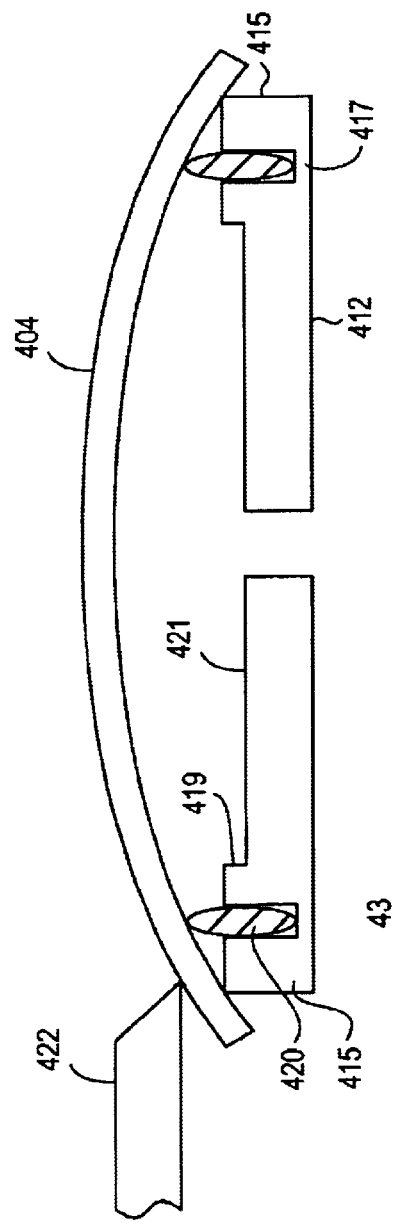
FIG. 4a
FIG. 4b

WAFER TEMPERATURE CONTROL APPARATUS AND METHOD

BACKGROUND OF THE INVENTION (1) Field of the Invention

The present invention relates to the field of semiconductor wafers processing. More specifically, the present invention relates to an assembly for holding a wafer subject to a process.

(2) Description of the Related Art

Semiconductor wafers are typically subject to a multitude of processes such as etching, thin film deposition, etc. Typically, in a plasma etching process, semiconductor wafers are inserted in a vacuum chamber where they are subject to plasma discharge. FIG. 1 shows a prior art plasma etching apparatus wherein the lower electrode 2 supports a wafer 4, subject to plasma etching. The wafer 4 is fixed in place, on the lower electrode 2, by a mechanical holding means such as a clamp 6. A gas container 8 including a heat transfer gas such as helium, by way of non-limiting example, is fed upwardly, relatively to this figure, to an aperture 10 of the lower electrode 2. The gas is then introduced into the volume defined between a top surface 12 of the lower electrode 2 and a bottom surface 14 of the wafer 4.

Helium is typically introduced between the wafer 4 and the lower electrode 2 for transferring heat between the wafer 4 and the lower electrode 2. The lower electrode 2 is maintained at a colder temperature by recirculating a cooling fluid via a channel 11 routed within the lower electrode 2. Conversely, the lower electrode 2 can be maintained at a higher temperature, when such operation is required, by circulating a fluid at a higher temperature via the channel 11. Accordingly, the helium gas provides a medium for heat transfer between the wafer 4 and the lower electrode 2.

Generally, the etching of the wafer 4 is performed by applying a source of RF power to the lower electrode 2 and coupling the walls 19 of the process chamber 23 to the ground. The etching of wafer 4 can be equally performed by applying the source of RF power to an upper electrode 24 while coupling the lower electrode 2 to the ground. When RF power is applied across these electrodes, i.e., the lower electrode 2 and the walls of the walls 19, a plasma discharge can be generated therebetween. In a preferred plasma etching process, fluorine-based plasma can etch a layer of Tungsten (W) of the wafer 4 by having the fluorine ions, disassociated in the plasma, react with the Tungsten layer of the wafer. The fluorine ions' reaction with the layer of Tungsten of the wafer causes the Tungsten layer to be etched. A Tungsten hexa-fluoride compound is formed as a result of the reaction. The reaction-between the plasma and the wafer, as well as the power dissipated to the wafer surface, causes the temperature of the wafer to rise. As the temperature of the wafer increases, the selectivity to the underlying layers of the wafer decreases causing the etching to become uncontrollable. Because the etching process is temperature sensitive, it is desirable to provide a mechanism for controlling the temperature of the wafer as well as for maintaining a substantially uniform temperature across the wafer.

The plasma etching process, generally, requires an inert gas, such as helium, to be introduced via the through hole passage 10 of the lower electrode 2 into the volume between the lower electrode 2 and the wafer 4. The heat transfer gas, however, is not limited to an inert gas, but can be any gas which can transfer heat with minimum heat loss and does not easily react with the process plasma in the process chamber 23. Typically, the heat transfer gas is maintained at a pressure which may vary between 0.1 and 15 Torr. Preferably 10 Torr is supplied from the heat transfer gas source into the volume between the wafer 4 and the lower electrode 2. The pressure of the heat transfer gas typically exceeds the pressure in the process chamber. Accordingly, the wafer 4 will bow as shown in this figure, thereby causing the center 18 of this wafer to be lifted further away, from the top surface 12 of the lower electrode 2, than the periphery 16 of the wafer. The bow-like shape of wafer 4, with the periphery 16 dose to the lower electrode 2, and the center 18 spaced apart from the top surface 12 of the lower electrode 2, contributes to non-uniform heat transfer between the lower electrode 2 and the wafer 4, as more heat is dissipated towards the periphery 16 of the wafer 4 and less heat is dissipated towards the center 18 of the wafer 4.

Additionally, the configuration shown in FIG. 1 poses considerable problems with respect to the sealing of wafer 4 against the lower electrode 2. Since both the wafer 4 and the lower electrode 2 are typically made of a hard material, the surfaces, of the wafer and of the lower electrode, which are in contact with each other, may not be able to provide adequate sealing due to the poor conformability of hard surfaces. Consequently, minor variations in the surface of the wafer and of the lower electrode may cause the helium gas to leak out, thereby causing fluctuations in the pressure of the helium.

It is desirable to provide for a plasma etching apparatus having a lower electrode supporting a wafer wherein a gas introduced between the lower electrode and the wafer produces substantially uniform heat transfer across the wafer. Additionally, it is desirable to provide for improved sealing between the wafer and the lower electrode.

BRIEF SUMMARY OF THE INVENTION

The present invention provides an assembly for holding a substrate. The substrate has a first surface, a second surface opposite the first surface, and an outer peripheral portion. The assembly includes a holding body having a support surface for supporting the substrate. The holding body has an aperture for passing therethrough a gas having a thermal conductivity. The assembly further includes a heat transferring seal having a first surface for frictionally engaging the second surface of the substrate. The heat transferring seal has a second surface, opposite the first surface, for frictionally engaging the support surface of the holding body. The heat transferring seal further has an inner peripheral portion defining an opening for receiving the gas. The heat transferring seal also has a thermal conductivity, closely matched with the thermal conductivity of the gas, for providing substantially uniform heat transfer across the substrate.

BRIEF DESCRIPTION OF THE DRAWINGS

The features, aspects, and advantages of the present invention will become more fully apparent from the following detailed description, appended claims, and the accompanying drawings in which:

FIG. 4a shows a first alternative embodiment according to the present invention;

FIG. 4b shows a second alternative embodiment according to the present invention;

DETAILED DESCRIPTION OF THE INVENTION

In the following description, numerous specific details are set forth to provide a thorough understanding of the present invention. However, one having an ordinary skill in the art may be able to practice the invention without these specific details. In some instances, well-known circuits, structures, and techniques have not been shown in detail to not unnecessarily obscure the present invention.

Figure 1:
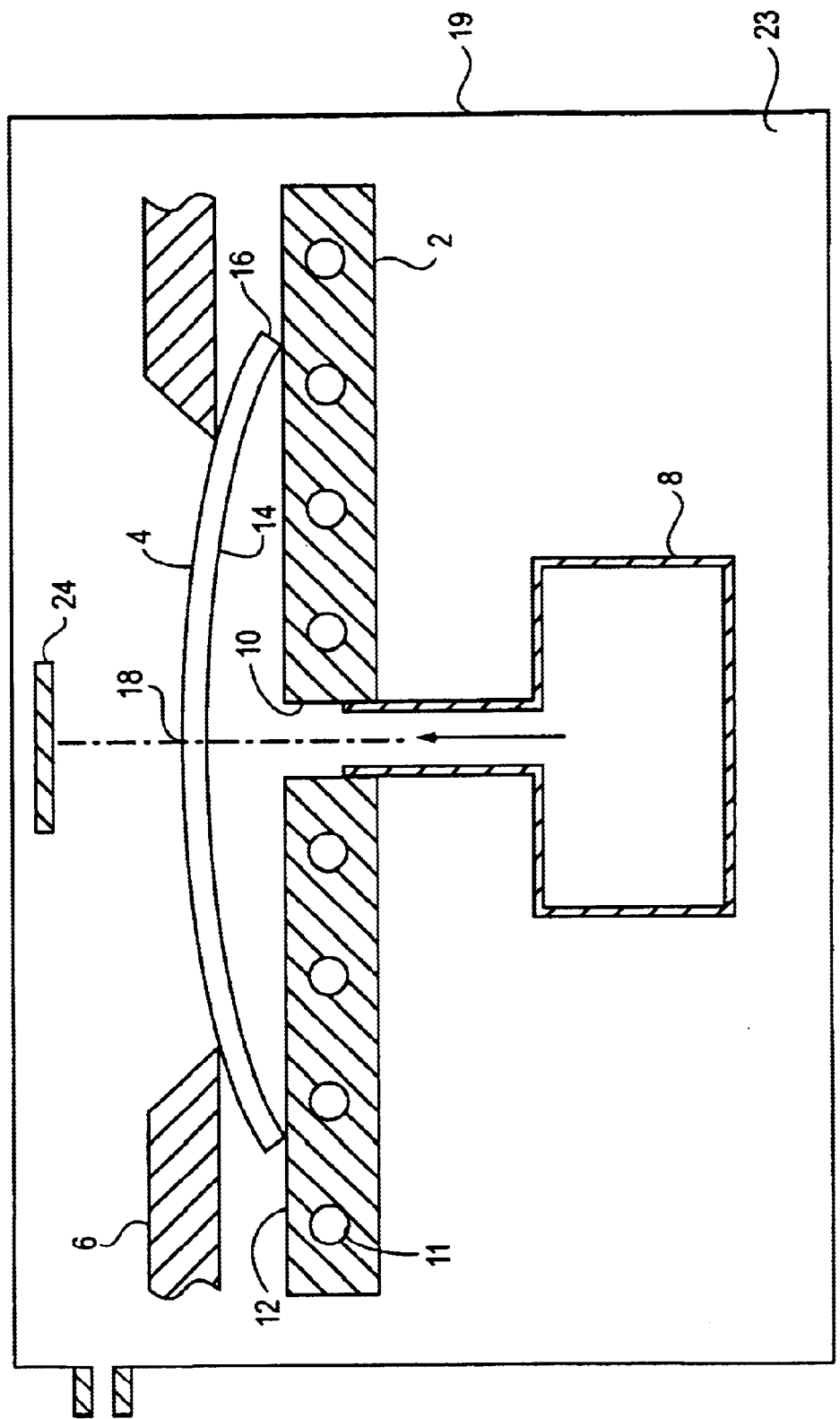
FIG. 1 shows a simplified prior art plasma etching apparatus.
Figure 2:
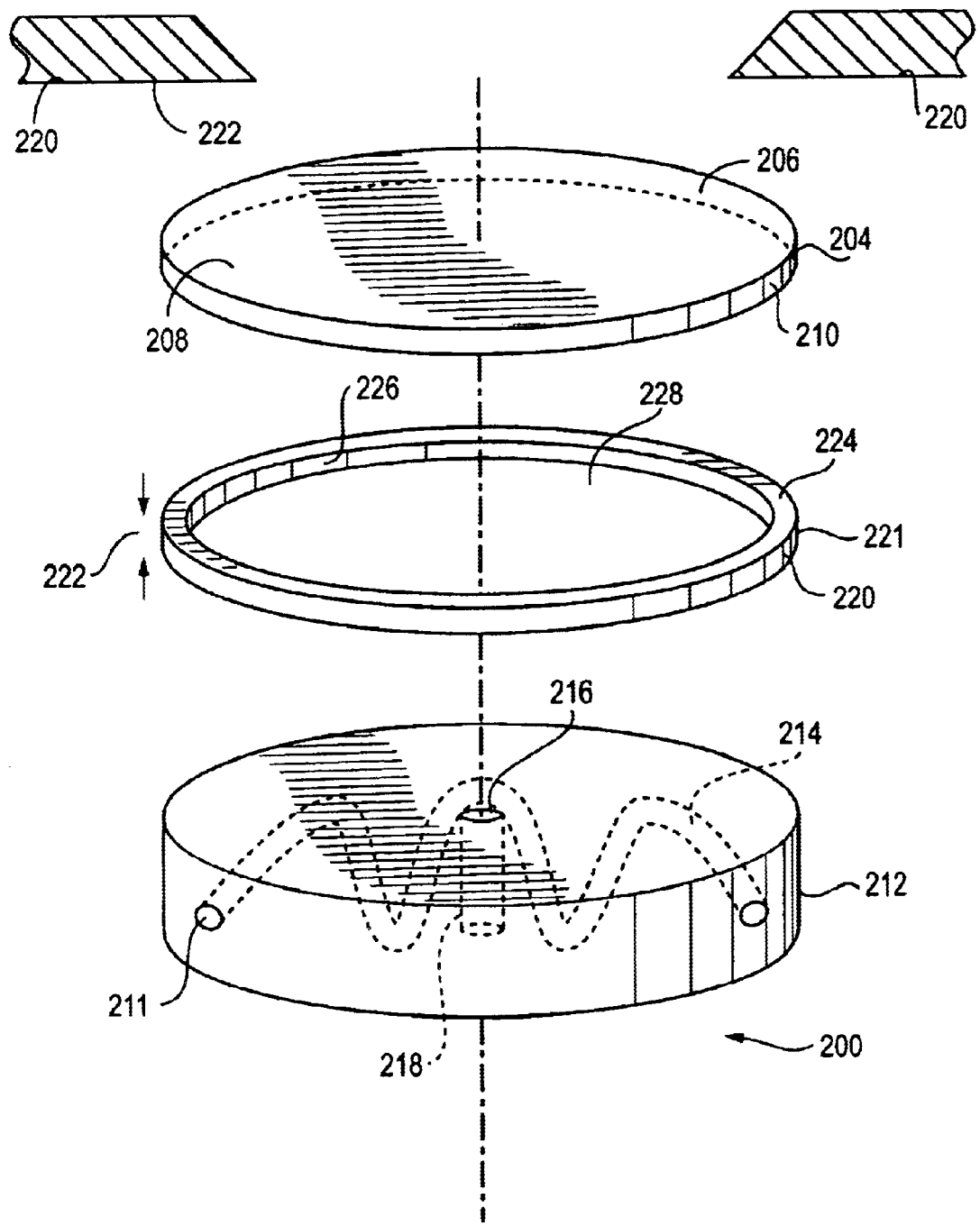
FIG. 2 shows a perspective view of an assembly for holding a substrate according to the present invention.

Referring to FIG. 2, a perspective view of an assembly 200 for holding a substrate 204 (e.g., having a thickness of approximately 25–125 microns), according to the present invention, is shown. The substrate 204 has a first surface 206 oriented upwardly, relative to the figure. This surface 206 is typically etched, in a plasma etching apparatus (not shown entirely), by inserting a gas into a process chamber (not shown) in which the assembly 200 is placed. The substrate 204 can be, by way of non-limiting example, a silicon wafer. Substrate 204 further has a second surface 208 (defined in part by the dotted line). Second surface 208, facing downwardly relative to the figure, is positioned opposite to the first surface 206. Substrate 204 further has an outer peripheral portion 210. In this particular example, the shape of the substrate 204 is substantially circular. However, the present invention is not limited to a circular substrate. Other shapes of substrates are also included within the scope of this invention.

The assembly 200, according to the present invention, further includes the holding body 212. This holding body is typically an electrode of aluminum which will be referred to as a "lower electrode." This electrode is used in the process of etching the substrate 204 in conjunction with a second electrode which is typically provided by the walls of the process chamber (not shown). This electrode, i.e., the holding body 212, as explained above, is typically coupled to a RF source while the walls of the process chamber are coupled to the ground. Conversely, if the electrode 212 is coupled to the ground, the walls of the process chamber will be coupled to a RF source. The holding body 212 has a support surface 214 positioned upwardly, relative to the figure, for supporting the substrate 204. The holding body 212 has an aperture 216 defined by a through hole (shown in dotted line) formed in the holding body 212. The through hole defined by the cylindrical wall 218 (shown in dotted lines) serves as a passage for a heat transfer gas, such as helium, which can be introduced between the holding body 212 and the substrate 204 when the assembly is assembled together. The aperture 216 can have a diameter of less than 1 millimeter, by way of non-limiting example. A clamp 290 typically locks the substrate 204 in retaining engagement with a heat transferring seal 220 according to the present invention. The clamp 290 has a lower surface defined, in part, by the side edge 222. This lower surface of clamp 290 frictionally engages the first surface 206 of the substrate 204 when the assembly 200 is assembled.

The assembly 200 further includes the heat transferring seal 220, according to the present invention. The heat transferring seal, in conjunction with the helium gas, provides substantially uniform heat transfer across the substrate 204 when the assembly is assembled. Additionally, the heat transferring seal 220 provides improved sealing between the holding body 212 and the substrate 204. The heat transferring seal 220, in the preferred embodiment illustrated in FIG. 2, is an annular body having a first surface 224, oriented upwardly, relative to the drawing, for frictionally engaging the second surface 208 of the substrate 204. The heat transferring seal 220 further has a second surface (not shown) oriented downwardly, relative to the figure, opposite the first surface, for frictionally engaging the support surface 214 of the holding body 212. Additionally, the heat transferring seal 220 has an inner peripheral portion 226, defining an opening 228, for receiving therethrough a heat transfer gas such as Helium, by way of non-limiting example, flown via the aperture 216 of the holding body 212. The heat transferring seal 220 is made of a material having a thermal conductivity closely matched with the thermal conductivity of the heat transfer gas for providing substantially uniform heat transfer across the wafer substrate 204.

Figure 3:
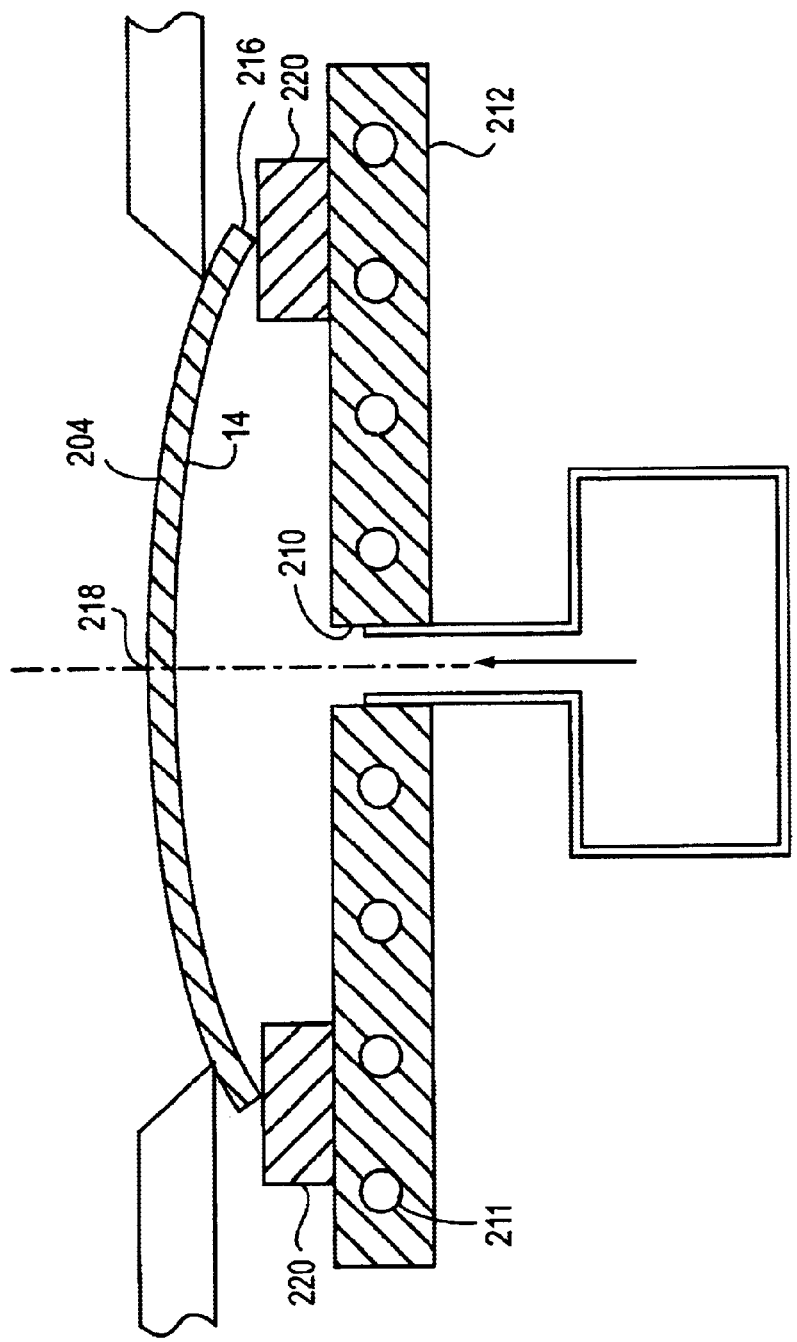
FIG. 3 shows a cross-sectional view of the assembly according to the present invention.

FIG. 3 shows a cross-sectional view of an assembled assembly according to the present invention. As one can see from this figure, the present invention provides for the heat transfer seal 220 inserted between the lower electrode 212 and the substrate 204. While, typically, in conventional plasma etching assemblies, substrate 204 would be directly laid over the top of the electrode 212, in the assembly according to the present invention the heat transferring seal 220 is inserted between the lower electrode 212 and the substrate 204, thereby raising the periphery of the substrate 204 off the electrode 212. By moving the outer periphery 217 away from the electrode, the heat transfer between the lower electrode 212 and the portion of the substrate abutting the outer peripheral portion 217 is reduced.

In the plasma etching assemblies of the prior art, the substrate 204 would be directly laid upon the holding body 212 and, thus, the ratio of the distance between the holding body and the center of the substrate and of the distance between the peripheral portion of the substrate and the holding body would be approximately infinite. Consequently, the discrepancy in heat transfer between the edge and the center of the substrate is substantial. By contrast, in the embodiment according to the present invention, as shown in FIG. 3, the heat transferring seal 220 will raise the peripheral portion 210 of the substrate 204 to a distance substantially equal to the thickness of the heat transferring seal 220. In this case, assuming that the thickness of the heat transferring seal 220 is approximately 75 microns (or, more generally, 25 to 125 ) microns and the distance between the center 219 of the substrate 204 and the first surface 214 of the holding body 212 is approximately 350–400 microns, the ratio between these distances will be finite and, thus, the discrepancy in heat transfer between the center and the periphery of the substrate will be substantially reduced.

Moreover, the heat transferring seal 220 is made of a material having a thermal conductivity closely matching the thermal conductivity of the heat transfer gas for providing substantially uniform heat transfer across the substrate. Accordingly, the heat transferring seal provides for more than separating the outer peripheral portion of the wafer from the holding body. The heat transferring seal 220 provides a medium for transferring heat which accounts for the thermal conductivity of the heat transferring gas for the purpose of providing uniform heat transfer across the substrate.

The ratio between the thermal conductivities of the two heat transfer media, i.e., the gas and the heat transferring seal, can be calculated to take into account: the distance D between the holding body and the substrate at the center of the substrate; the distance T between the holding body and the substrate at the periphery of the substrate; the pressure P of the gas, and the type of gas. Generally, the heat transfer between two objects having temperatures T1 and T2 is proportional to the difference in temperatures between the two objects (T1–T2). The heat transfer is also proportional to the thermal conductivity G of the object which transfers the heat, and also to the cross-section of the heat transfer path. A heat transfer function $H_T$ can thus be represented by the following function $$H_T \approx F[G, (T1-T2), S].$$

Accordingly, one could define, for both the heat transferring gas and for the heat transferring seal, a heat transfer function according to the formula shown above. Furthermore, by requesting that the heat transfer across the substrate will be substantially uniform, one can obtain the equation $F(G_{gas}, (T1-T2), S_{gas})=F[G_{seal}, (T1-T2), S_{seal}]$. One could then determine the ratio or the relation between the thermal conductivity of the gas and the thermal conductivity of the seal such that the heat transfer between the lower electrode and the substrate is substantially uniform across the substrate.

Additionally, the heat transferring seal 220 is made of a material which substantially conforms to variations in the surface of the holding body 212 and of the substrate 204. Such material, which can be by way of non-limiting example, Kapton (poly(pyromellitimido-1,1',4,4'-diphenylene ether)), is typically softer than both the holding body 212 and the substrate 204. A Kapton (poly(pyromellitimido-1,1',4,4'-diphenylene ether)) seal, in the assembly according to the present invention, can conform to variations in the surfaces, of the substrate and of the holding body, of approximately 5 microns. Kapton (poly(pyromellitimido-1,1',4,4'-diphenylene ether)), thus, can provide substantially airtight contact between the wafer 204 and the holding body 212. Moreover, the second surface (lower surface) of the Kapton (poly(pyromellitimido-1,1',4,4'-diphenylene ether)) seal can have an adhesive layer such that the Kapton (poly(pyromellitimido-1,1',4,4'-diphenylene ether)) seal can be locked in adhering engagement with the lower electrode 212.

Going back to FIG. 2, the heat transferring seal 220 has an outer peripheral portion 221 with a shape substantially conforming to the shape of the outer peripheral portion of the substrate 204. As the substrate 204 has a substantially circular shape, the shape of the outer peripheral portion 221 of the seal 220, in FIG. 2, is shown to be equally circular. Typically, the outer peripheral portion 221 of the seal has a perimeter with a size larger than the size of the perimeter of the outer peripheral portion 210 of the substrate 204. However, the inner peripheral portion 226 of the seal 220 has a perimeter with a size smaller than the size of the perimeter of the outer peripheral portion of the substrate. By ensuring that the substrate and the seal are aligned concentrically, during the plasma etching process, the helium gas will be substantially prevented from escaping outside the volume defined by the substrate, the seal, and the lower electrode.

FIG. 4a shows a first alternative embodiment of the present invention wherein a holding body 312 has a groove 317 abutting a peripheral portion 315 of the holding body 312. The groove 317, positioned between the peripheral portion 315 and the main portion of the holding body 312, serves the purpose of separating the peripheral portion 315 from the rest of the holding body 312. As the heat transfer is proportional with the cross section of the heat flow path, the heat transfer between the peripheral portion 315 of the holding body 312 and a main part of the holding body will be reduced due to the lower cross section of the portion 317. Accordingly the groove 317 serves, among other things, the purpose of reducing the heat transfer at a periphery 316 of a substrate 304. The rest of the configuration of the assembly shown in FIG. 4 is substantially similar with the configuration of the assembly shown in FIG. 3 which is hereby incorporated by reference.

FIG. 4b shows a second alternative embodiment of the present invention wherein a holding body 412 has a groove 417 abutting a peripheral portion 415 of the holding body 412. The holding body 412 has a similar structure as the holding body 312 of FIG. 4a, with the exception that the holding body 412 has a step down 419 made in the upper part of this holding body by having a recess 421 carved in a central portion of the upper part of the holding body 412. Additionally, the heat transferring seal 420, in this particular embodiment, can be an 0 ring with a cross-section having a diameter or a width equal or greater than the width of the groove 417 (e.g., approximately 3 to 4 mm). The heat transferring seal 420 performs a similar function, in this particular embodiment, as the heat transferring seal 220 and 320 in FIGS. 2 and 3. The heat transferring seal, in this particular embodiment, has the function of sealing the assembly, as the step-down 419 in the upper part of the holding body 412 takes care of providing the elevation desired at the peripheral portion of the substrate 404 to balance the heat transfer between the holding body 412 and a substrate 404. The stiffness of the heat transferring seal 420 should be such that the clamp 422 can maintain the substrate 404 in engagement with the peripheral portion of the holding body 412.

Figure 4C:
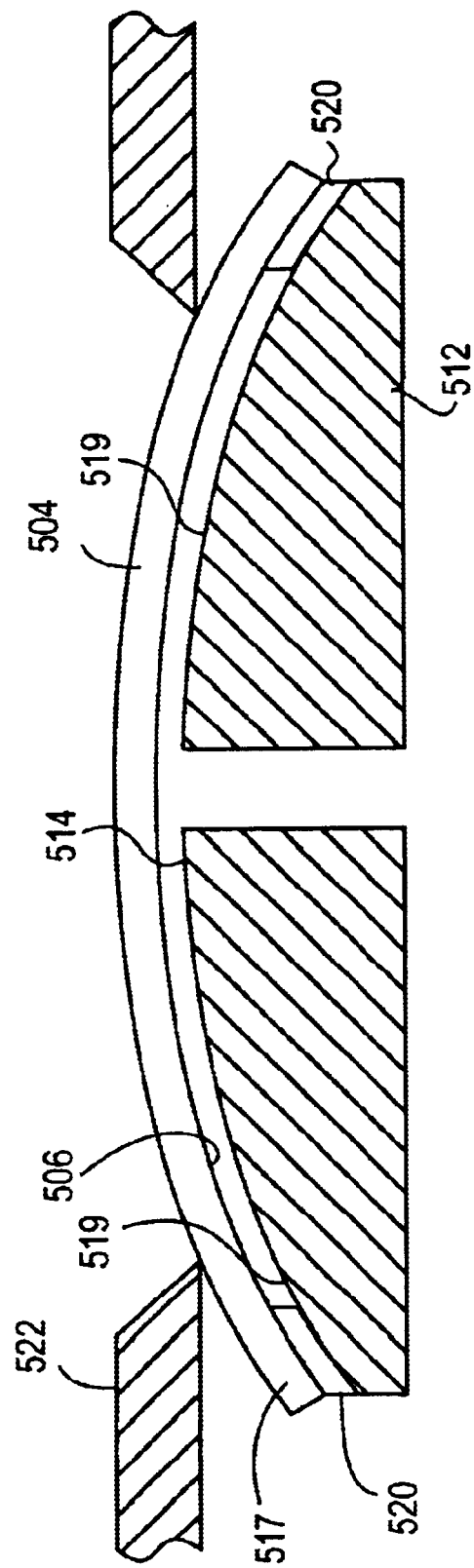
FIG. 4c shows a third alternative embodiment according to the present invention.

FIG. 4c shows a third alternative embodiment according to the present invention. As one can see, a holding body 512 has a central upper portion 514 having a curvature substantially conforming to the curvature of a substrate 504. A heat transferring seal 520, substantially similar with the one explained in conjunction with FIGS. 2 and 3 is placed upon the holding body 512. A peripheral portion of the holding body 512 is thus in frictional engagement with a peripheral portion of a lower surface of the heat transferring seal The heat transferring seal has an upper surface which frictionally engages a lower surface of substrate 504. As one can see, the holding body 512 with the curved central upper portion provides for a substantially uniform gap between the substrate and an upper surface 519 of the holding body. This causes a more uniform heat transfer across the substrate 504. The rest of the features of the assemblies of FIGS. 4b–4c are substantially similar with the features of the holding assembly illustrated in FIGS. 2 and 3. Consequently, the features of the assembly described above in conjunction with FIGS. 2 and 3 are thus herein incorporated by reference.

Figure 5:
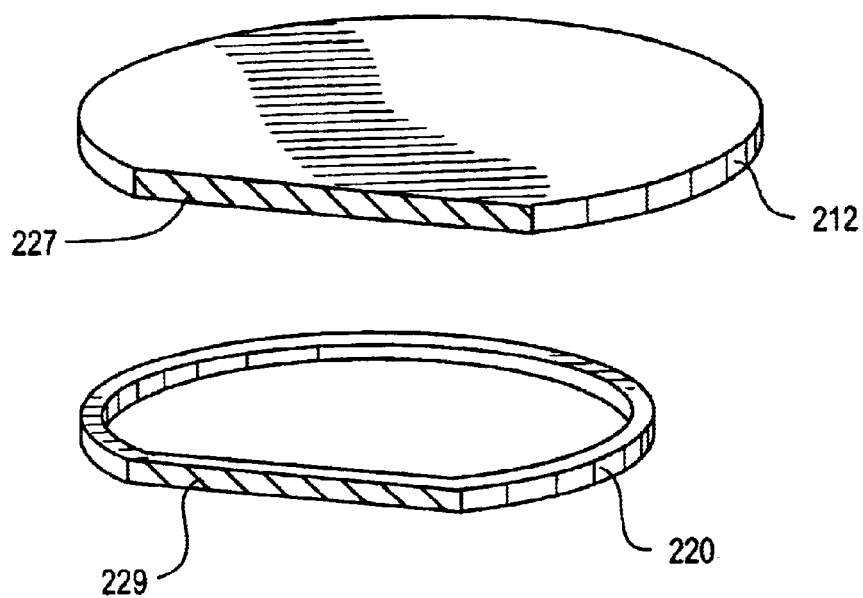
FIG. 5 shows alternative shapes for a substrate and for a heat transferring seal according to the present invention.

FIG. 5 shows alternative shapes for a substrate and a heat transferring seal according to the present invention. As one can see, the substrate 512 and the heat transferring seal 530 have flat portions 527 and 529, respectively, at their peripheries. The purpose for this flat portion at the periphery of the substrate 512 is to indicate the crystal orientation in the substrate 512. But, for this structural difference, the features of the heat transferring seal 520 and the rest of the assembly are substantially similar to the features of the holding assembly illustrated in FIGS. 2 and 3. The features of the assembly described above in conjunction with FIGS. 2 and 3 are thus herein incorporated by reference.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method of making a semiconductor structure, comprising:

plasma etching a surface of a substrate; and transferring heat from said substrate to (i) a seal on a support surface, and (ii) a gas in a space defined by said substrate, said seal and said support surface, uniformly across said substrate, said seal being in contact with an opposing surface of said substrate.

2. The method of claim 1, wherein said substrate is held in an assembly, said assembly comprising a holding body having said support surface, said holding body having an aperture for passing therethrough said gas, and wherein said seal has an inner peripheral portion defining an opening for receiving said gas.

3. The method of claim 2, wherein said assembly further comprises a clamp frictionally engaging said surface of said substrate.

4. The method of claim 1, wherein said seal has a thickness of 25 to 125 microns.

5. The method of claim 1, wherein said seal has an outer peripheral portion with a shape substantially conforming to a shape of an outer peripheral portion of said substrate.

6. The method of claim 2, wherein said space is substantially airtight.

7. The method of claim 1, wherein said seal has a width of approximately 3 to 4 mm.

8. The method of claim 1, wherein the substrate has a thickness of approximately 25 to 125 microns.

9. The method of claim 1, wherein said gas comprises helium.

10. The method of claim 1, wherein said seal comprises poly(pyromellitimido-1,1',4,4'-diphenylene ether).

11. A method of making a semiconductor structure, comprising:

a step for etching a surface of a substrate;

wherein said substrate is in contact with means for providing uniform heat transfer across said substrate.

12. The method of claim 11, wherein said means comprises a seal, a gas and a support surface, said seal is between said substrate and said support surface, and in contact with said substrate and said support surface, said substrate, said seal and said support surface defining a space, said gas is in said space, and heat transfer through said seal and said first gas provides said uniform heat transfer across said substrate.

13. The method of claim 11, wherein said substrate is held in an assembly, said assembly comprising a holding body having a support surface, said holding body having an aperture for passing therethrough a gas.

14. The method of claim 12, wherein said seal has an outer peripheral portion with a shape substantially conforming to a shape of an outer peripheral portion of said substrate.

15. The method of claim 12, wherein said space is substantially airtight.

16. The method of claim 12, wherein said gas comprises helium.

17. A method of making a semiconductor structure, comprising:

plasma etching a surface of a substrate;

wherein said substrate has a uniform temperature.

18. A method of making a semiconductor device, comprising:

making a semiconductor structure by the method of claim 1; and making a semiconductor device comprising the semiconductor structure.

19. A method of making an electronic device, comprising:

making a semiconductor device by the method of claim 18; and making an electronic device comprising the semiconductor device.

20. In a method of making a semiconductor structure, including plasma etching a substrate, wherein the substrate is on a lower electrode, and a gas is fed through the lower electrode toward the substrate, the improvement comprising a seal between the substrate and the lower electrode having a heat conductivity providing uniform heat transfer across the substrate.

* * * * *